US000001200H

United States Statutory Invention Registration [19]

[11] Reg. Number: H1200

Neifeld

[43] Published: Jun. 1, 1993

[54] METHOD OR CREATING X-RAYS FROM A PULSED LASER SOURCE USING A GASEOUS MEDIUM

[75] Inventor: Richard A. Neifeld, Springfield, N.J.

[73] Assignee: The United States of America as represented by the Secretary of the Army, Washington, D.C.

[21] Appl. No.: 540,717

[22] Filed: Jun. 15, 1990

[51] Int. Cl.[5] ..... H01J 35/20

[52] U.S. Cl. ..... 378/119; 378/120; 378/123

[58] Field of Search ..... 378/119, 120, 143; 376/103, 122, 123, 144, 145

[56] References Cited

U.S. PATENT DOCUMENTS 3,677,890 7/1972 Hartman ..... 376/137
3,764,466 10/1973 Dawson ..... 376/146
3,961,197 6/1976 Dawson ..... 378/119

FOREIGN PATENT DOCUMENTS 0304597 12/1988 Japan ..... 378/119

*Primary Examiner*—Linda J. Wallace
*Attorney, Agent, or Firm*—Roy E. Gordon; Michael Zelenka

[57] ABSTRACT

X-rays are created from a pulsed laser using a gaseous medium by focusing a laser pulse to a focal point in a gaseous medium causing a laser induced plasma in the gas which plasma emits x-rays.

12 Claims, No Drawings

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD OR CREATING X-RAYS FROM A PULSED LASER SOURCE USING A GASEOUS MEDIUM

The invention described herein may be manufactured, used, and licensed by or for the Government for governmental purposes without the payment to me of any royalty thereon.

This invention relates in general to a method of creating x-rays, and in particular to such a method using a gaseous medium.

BACKGROUND OF THE INVENTION

Heretofore x-rays have been produced using high voltage tubes where electrons impinge upon metal anodes. These tubes are relatively inefficient, require high voltages, and vacuum tubes for ballistic electron transport. The low intensity capable by this technology and the minimum energy capable of passing through the necessary windows from the vacuum tube to room pressure make these tubes incapable of meeting current technological needs for bright and soft x-ray sources such as x-ray lithography.

Synchrotrons have been proposed and are now being used on a research basis for x-ray lithography. The huge size, weight, cost and complicated nature of synchrotrons are severe disadvantages for use of these machines for x-ray lithography.

A newer source for soft x-ray is the laser induced plasma source. In this type of machine an intense laser pulse incident upon a solid target material creates a dense plasma from the target material, destroying it. The plasma generates an x-ray pulse.

SUMMARY OF THE INVENTION

The general object of this invention is to provide a method of producing x-rays. A more specific object of this invention is to provide such a method that does not require complex and costly equipment, that does not require an expendable target source, that does not produce undesirable side effects such as high velocity particulate associated with ablation of solid targets by an intense laser pulse, and that allows a large solid angle in which x-rays are emitted isotropically. A still more specific object of this invention is to produce an x-ray source for the task of x-ray lithography that is more capable than existing sources.

It has now been found that the aforementioned objects can be attained by a method comprising focusing a laser pulse to a point in a gas, causing a laser induced plasma in the gas which plasma emits x-rays.

The gaseous medium may be partially ionized prior to focusing the laser pulse. The partial ionization of the gaseous medium may be attained by a number of means including using a DC discharge, an AC or microwave discharge, by focusing two laser pulses at the focal point separated by a short time interval on the order of 1 to 100 nsec, or by application of a continuous wave focused high power laser beam with sufficient intensity to create a continuous laser induced plasma.

The energy spectrum of x-rays emitted depends upon the gas medium near the focal point, the laser intensity near the focal point, the laser pulse duration, the laser wavelength, and the amount of ionization present near the laser focal point prior to the application of the laser pulse. The energy spectrum of x-rays impinging upon a substrate depend upon the emission spectrum and upon absorption in the intervening gaseous medium between the focal point and the substrate.

DESCRIPTION OF THE PREFERRED EMBODIMENT

A Helium gas filled chamber encloses the focal point of an optical system, a small nozzle for flowing Argon gas, and substrate fixturing. The Argon nozzle is positioned within one inch of the laser focal point but not in the path of the laser beam. A YAG laser and focusing lens are positioned so that the YAG laser pulse passes through the lens and is focused at the aforementioned focal point. The Argon gas is passed through the focal point of the lens. At the focal point, the intense laser pulse acting upon the Argon gas creates a plasma that emits x-rays. The x-rays travel through the chamber filled with He gas and impinge upon substrates positioned to receive the desired x-ray exposure.

In the foregoing embodiment, it is important that Argon gas be present at the focal point in order to provide the proper medium for x-ray generation from the laser induced plasma. The Argon nozzle position and the Argon gas flow rate are adjusted so that a substantial fraction of the gas atoms present in the vicinity of the focal point are Argon atoms. The x-rays generated by the plasma near the focal point disperse isotropically into the surrounding Helium gas medium. This is because the chamber is filled with Helium except near the Argon nozzle as Helium has a low x-ray absorption coefficient. In order to keep the vast majority of the gas in the chamber as Helium, there must be a constant flow of Helium into the chamber in order to flush out the Argon.

The whole system in this embodiment can fit upon a table of about 4 feet by 8 feet. Existing lasers capable of laser pulses of less than 10 nanoseconds and energies greater than 0.01 joules per pulse, and divergences of less than 10 milliradians can be used, ideally with pulse lengths less than 1 nanosecond, pulse energies greater than 1 joule and divergences of less than 4 milliradians. The lens should be a short focal length lens with focal length less than 5 centimeters. The substrate should be placed within 2 feet and ideally within 1 foot of the focal point.

In lieu of the YAG laser, one might use an Excimer laser or a Ruby laser or any other laser capable of producing a short and intense pulse capable of causing a laser induced plasma in a gaseous medium.

In lieu of the Helium gas, one might use Hydrogen gas or any other medium which has a low absorption cross section for soft x-ray Since the absorption cross section is a function of total electron density this indicates that only low atomic number gases having an atomic number less than 20 may be used in place of Helium.

In lieu of Argon, one might use Xenon or Krypton or other heavy inert gas. In general one should use gases that produce the desired x-ray spectrum. Since the characteristic x-ray lines are known, and determined by the energy levels of the electrons in atoms, one should use gases that allow x-ray transitions of the desired energy, and that can be generated in the laser induced plasma. Additionally one might use gases that can be easily broken down such as nitrous oxide and in these gases partially ionize the gas before arrival of the intense laser pulse. Such preionization increases x-ray generation.

The aforementioned method does not produce particulate, is not directional and does not require replenishing a solid target as in the laser induced x-ray source using a solid target. The equipment required in the aforementioned method is relatively small, lightweight and inexpensive compared to the synchrotron type sources.

The method of the invention is not limited to producing x-rays for use in x-ray lithography but can also be used for other x-ray applications such as radiology and spectroscopy.

I wish it to be understood that I do not desire to be limited to the exact details of construction shown and described for obvious modifications will occur to a person skilled in the art.

What is claimed is:

1. Method of creating x-rays from a pulsed laser using a gaseous medium comprising focusing a laser pulse to a focal point in a gaseous medium causing a laser induced plasma in the gas which plasma emits x-rays.

2. Method according to claim 1 wherein the gaseous medium is partially ionized near the focal point prior to focusing the laser pulse.

3. Method according to claim 2 wherein the gaseous medium is partially ionized using a DC discharge.

4. Method according to claim 2 wherein the gaseous medium is partially ionized using an AC discharge.

5. Method according to claim 2 wherein the gaseous medium is partially ionized using a microwave discharge.

6. Method according to claim 2 wherein the gaseous medium is partially ionized by focusing two laser pulses at the laser focal point separated by a short time interval on the order of about 1 to about 100 nsec.

7. Method according to claim 2 wherein the gaseous medium is partially ionized by the application of a continuous wave focused high power laser beam with sufficient intensity to create a continuous laser induced plasma.

8. Method according to claim 1 wherein a nozzle near the focal point emits a gas which passes through the focal point.

9. Method according to claim 8 wherein the gas used is a heavy inert gas.

10. Method according to claim 9 wherein the heavy inert gas is argon.

11. Method according to claim 9 wherein the x-rays emitted travel through a chamber filled with a gas that has atomic number less than 20 and impinge upon substrates positioned to receive desired x-ray exposure of the substrate for x-ray lithography.

12. Method according to claim 11 wherein the gas that has atomic number less than 20 is Helium.

* * * * *